(12) United States Patent
Takahashi

(10) Patent No.: US 9,500,722 B2
(45) Date of Patent: Nov. 22, 2016

(54) MAGNETIC FIELD MEASUREMENT APPARATUS

(71) Applicant: SEIKO EPSON CORPORATION, Tokyo (JP)

(72) Inventor: Satoshi Takahashi, Komae (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/606,668

(22) Filed: Jan. 27, 2015

(65) Prior Publication Data

US 2015/0219729 A1    Aug. 6, 2015

(30) Foreign Application Priority Data

Jan. 31, 2014   (JP) .................................. 2014-017493

(51) Int. Cl.
*G01R 33/032*    (2006.01)

(52) U.S. Cl.
CPC .................................. *G01R 33/032* (2013.01)

(58) Field of Classification Search
CPC combination set(s) only.
See application file for complete search history.

(56) References Cited

U.S. PATENT DOCUMENTS 3,629,694 A * 12/1971 Hearn .................... G01R 33/26
250/573
4,694,243 A * 9/1987 Miller .................... G01D 5/344
324/96
2007/0040554 A1   2/2007 Seki et al.
2011/0193555 A1   8/2011 Sugioka et al.

FOREIGN PATENT DOCUMENTS

| | | |
|---|---|---|
| JP | H05-119129 A | 5/1993 |
| JP | 2006-340936 A | 12/2006 |
| JP | 2009-162554 A | 7/2009 |
| JP | 2009-236599 A | 10/2009 |
| JP | 2011-237362 A | 11/2011 |
| JP | 2012-168078 A | 9/2012 |
| JP | 2012-237698 A | 12/2012 |
| JP | 2013-079893 A | 5/2013 |
| JP | 2013-164312 A | 8/2013 |
| WO | 2009/084731 A1 | 7/2009 |

* cited by examiner

*Primary Examiner* — Walter L Lindsay, Jr.
*Assistant Examiner* — Jas Sanghera
(74) *Attorney, Agent, or Firm* — Oliff PLC

(57) ABSTRACT

Gas cells allow first detection light and second detection light to pass therethrough and rotate the polarization plane of linearly polarized light in accordance with a magnetic field. A first detection section and a second detection section detect the polarization planes of the linearly polarized light that has passed through the gas cells. A third detection section and a fourth detection section detect the polarization planes of the linearly polarized light that has not passed through the gas cells. A measurement section uses detection results from the first detection section and the third detection section to remove influence of optical noise contained in the first detection light, uses detection results from the second detection section and the fourth detection section to remove influence of optical noise contained in the second detection light, and measures the difference in the magnetic field between the gas cells.

5 Claims, 1 Drawing Sheet

MAGNETIC FIELD MEASUREMENT APPARATUS

This application claims the benefit of Japanese Patent Application No. 2014-017493, filed on Jan. 31, 2014. The content of the aforementioned application is incorporated herein by reference in its entirety.

BACKGROUND

1. Technical Field

The present invention relates to a magnetic field measurement apparatus using light.

2. Related Art

Some magnetic field measurement apparatus using light measure a very weak magnetic field, such as a magnetic field from the heart (magnetocardiogram) and a magnetic field from the brain (magnetoencephalogram), and are expected to be applied, for example, to medical image diagnosis apparatus. To measure a very weak magnetic field, it is necessary to remove influence of earth magnetism and other magnetic noise. JP-A-2009-162554 describes an atomic magnetism sensor that allows high-sensitivity measurement of a magnetic field gradient by converting a difference in magnetic field intensity between different measurement positions into a difference in the angle of rotation of polarization of laser light for probing linearly polarized light.

The atomic magnetism sensor described in JP-A-2009-162554, however, cannot remove optical noise produced when light is exposed, for example, to sound or heat and contained in the light.

SUMMARY

An advantage of some aspects of the invention is to provide a magnetic field measurement apparatus that removes influence of optical noise.

A magnetic field measurement apparatus according to an aspect of the invention includes a first medium that allows light from a first light source to pass therethrough and rotates a first polarization plane of linearly polarized light in accordance with the intensity of a magnetic field, a second medium that allows light from a second light source to pass therethrough and rotates a second polarization plane of linearly polarized light in accordance with the intensity of the magnetic field, a first detection section that detects the first polarization plane of the linearly polarized light that has passed through the first medium, a second detection section that detects the second polarization plane of the linearly polarized light that has passed through the second medium, a third detection section that detects the polarization plane of the linearly polarized light that has originated from the first light source but has not passed through the first medium, a fourth detection section that detects the polarization plane of the linearly polarized light that has originated from the second light source but has not passed through the second medium, and a measurement section that uses a detection result from the third detection section to remove optical noise from a detection result from the first detection section, uses a detection result from the fourth detection section to remove optical noise from a detection result from the second detection section, and uses the detection results from the first detection section and the second detection section from each of which the optical noise has been removed to measure a difference between the magnetic field in the first medium and the magnetic field in the second medium.

According to the configuration described above, influence of optical noise can be removed.

In the aspect described above, it is preferable that the first medium is formed of a plurality of first media, and that the number of third detection sections is smaller than the number of first media.

According to the configuration described above, the magnetic field in the first medium can be measured with improved accuracy.

In the aspect described above, it is preferable that the light from the first light source is divided into a plurality of light beams that pass through the plurality of respective first media, and that the third detection section is provided in correspondence with the optical path of the light before divided.

According to the configuration described above, the number of third detection sections can be reduced.

In the aspect described above, it is preferable that the measurement section measures a magnetic field produced by an object under measurement in the form of the difference, that the first medium is disposed in a position closer to the object under measurement than the second medium, and that the number of second media is smaller than the number of first media.

According to the configuration described above, the magnetic field in the first medium that is more subject to the magnetic field produced by the object under measurement than the magnetic field in the second medium can be measured with improved accuracy.

In the aspect described above, it is preferable that the second medium is formed of a plurality of second media, and that the number of fourth detection sections is smaller than the number of second media.

According to the configuration described above, the number of fourth detection sections can be reduced.

In the aspect described above, it is preferable that the light from the second light source is divided into a plurality of light beams that pass through the plurality of respective second media, and that the fourth detection section is provided in correspondence with the optical path of the light before divided.

According to the configuration described above, the magnetic field in the second medium can be measured with improved accuracy.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. Embodiment

Figure 1:
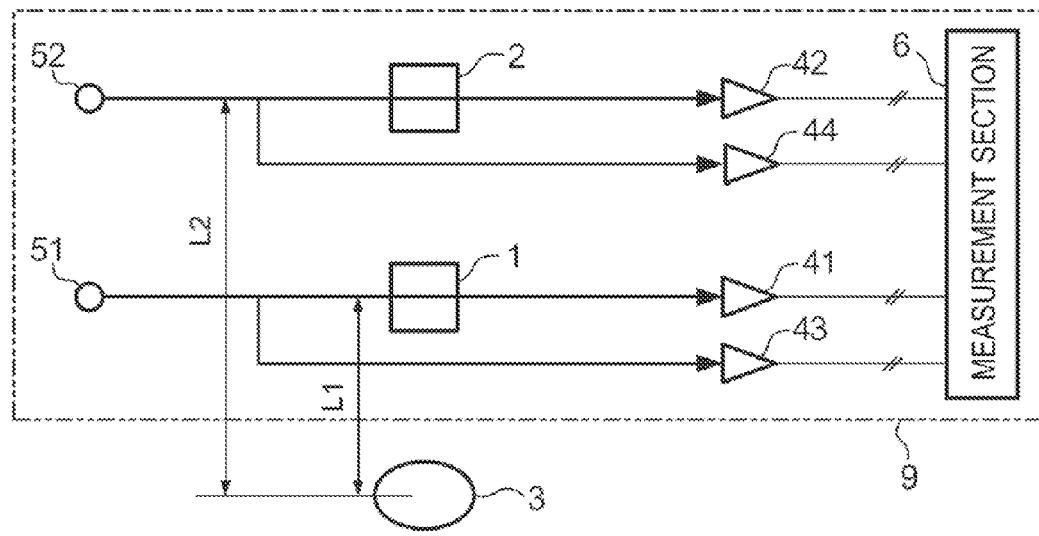
FIG. 1 shows an overall configuration of a magnetic field measurement apparatus according to an embodiment.

FIG. 1 shows an overall configuration of a magnetic field measurement apparatus 9 according to an embodiment of the invention. The magnetic field measurement apparatus 9 includes a gas cell 1, which is separate from an object under measurement 3 by a distance L1, and a gas cell 2, which is separate from the object under measurement 3 by a distance L2. The two distances have the relation of L1<L2. That is, the gas cell 2 is disposed at a location farther away from the object under measurement 3 than the gas cell 1.

The magnetic field measurement apparatus 9 further includes a light source 51, a light source 52, a first detection section 41, a second detection section 42, a third detection section 43, a fourth detection section 44, and a measurement section 6. Each of the light source 51 and the light source 52 is an apparatus that applies what is called probe light to the gas cell 1 or the gas cell 2 and is, for example, a laser light output apparatus that outputs laser light.

Each of the first detection section 41, the second detection section 42, the third detection section 43, and the fourth detection section 44 is, for example, a combination of a polarizing beam splitter or a Wollaston prism and a photodetector, separates light into a component along an a axis and a component along a β axis, measures optical intensities of the two components, and outputs a signal according to the sum of the optical intensities and a signal according to the difference between the optical intensities to detect the polarization plane of linearly polarized light contained in the light.

The measurement section 6 includes a computation processing device, such as a CPU (central processing unit), and a storage device, such as a ROM (read only memory) and a RAM (random access memory), and executes a program stored in the storage device. The measurement section 6 performs predetermined computation on a signal outputted from each of the detection sections.

Each of the gas cells 1 and 2 is a cell (element) that is made of glass and seals a group of atoms formed of a plurality of gas atoms excited with light. The gas atoms are, for example, potassium (K), rubidium (Rb), cesium (Cs), and other alkali metal atoms. Each of these atoms has a property as a medium that rotates the polarization plane of light passing therethrough in accordance with the intensity of a magnetic field. Each of the gas cells is not necessarily made of glass and may instead be made, for example, of a resin or any other material that allows light to pass therethrough. The gas atoms sealed in each of the gas cells 1 and 2 shown in FIG. 1 are excited with pumping light (not shown) and therefore polarized.

The light source 51 (first light source) emits detection light (hereinafter referred to as first detection light) containing linearly polarized light. The first detection light is divided into at least two light beams with one of them applied to the first detection section 41 via the gas cell 1 and the other applied directly to the third detection section 43. The gas cell 1 allows the first detection light to pass therethrough and rotates the polarization plane of the linearly polarized light contained in the first detection light in accordance with the intensity of a magnetic field. In the following description, the polarization plane of the linearly polarized light contained in the first detection light that has passed through the gas cell 1 is called a first polarization plane, and the polarization plane of the linearly polarized light contained in the first detection light that has not passed through the gas cell 1 is called a third polarization plane.

The first detection light is so applied to the gas cell 1 that the first detection light intersects the pumping light described above in the gas cell 1.

The light source 52 (second light source) emits detection light (hereinafter referred to as second detection light) containing linearly polarized light. The second detection light is divided into at least two light beams with one of them applied to the second detection section 42 via the gas cell 2 and the other applied directly to the fourth detection section 44. The gas cell 2 allows the second detection light to pass therethrough and rotates the polarization plane of the linearly polarized light contained in the second detection light in accordance with the intensity of the magnetic field. In the following description, the polarization plane of the linearly polarized light contained in the second detection light that has passed through the gas cell 2 is called a second polarization plane, and the polarization plane of the linearly polarized light contained in the second detection light that has not passed through the gas cell 2 is called a fourth polarization plane.

The second detection light is so applied to the gas cell 2 that the second detection light intersects the pumping light described above in the gas cell 2. The light sources 51 and 52 may be divided light sources that form a common single light source.

The first detection section 41 detects the first polarization plane. The second detection section 42 detects the second polarization plane. The third detection section 43 detects the third polarization plane. The fourth detection section 44 detects the fourth polarization plane.

The object under measurement 3 produces magnetism to be measured and is, for example, the heart of a person. The magnetism produced by the object under measurement 3 is relatively very weak, and the difference between the distance from the object under measurement 3 to the gas cell 1 and the distance therefrom to the gas cell 2 therefore affects the rotation of the polarization plane of each of the detection light beams. Specifically, the intensity of the magnetic field in the gas cell 1, which is disposed in a position closer to the object under measurement 3 than the gas cell 2, is greater than the intensity of the magnetic field in the gas cell 2 in the measurement. That is, "magnetism M1," which is defined as the magnetism produced by the object under measurement 3 and measured in the gas cell 1, and "magnetism M2," which is defined as the magnetism produced by the object under measurement 3 and measured in the gas cell 2, satisfy M2<M1. It is noted that the intensity of a magnetic field under measurement is inversely proportional to the square of the distance. For example, when the distance from the object under measurement 3 to the gas cell 2 is twice the distance from the object under measurement 3 to the gas cell 1, the intensity of the magnetic field produced by the object under measurement 3 and measured in the gas cell 2 is one-fourth the intensity of the magnetic field produced by the object under measurement 3 and measured in the gas cell 1.

The gas cells 1 and 2 are exposed to magnetic noise Nm in an external environment. The magnetic noise Nm in an external environment is, for example, earth magnetism and, it is believed that the magnetic noise Nm is not affected by the arrangement of the gas cells 1 and 2 but is always substantially the same.

Each of the first detection light, the second detection light, and the pumping light, which is not shown, is caused to contain optical noise when the optical path of the light is under vibration due, for example, to sound or a medium through which the light travels expands due to heat. The magnitudes of optical noise produced in the optical paths differ from each other in some cases. Further, the magnetic noise Nm does not affect the light that passes through none of the gas cells, but the optical noise affects also the light that passes through none of the gas cells. In the following description, the optical noise contained in the first detection light and the second detection light is called optical noise N1 and optical noise N2, respectively.

The polarization plane of the linearly polarized light to be detected with each of the detection sections is therefore affected as follows.

That is, the first detection section 41 detects the first polarization plane affected by the strong magnetism M1 produced by the object under measurement 3, the magnetic noise Nm, and the optical noise N1 contained in the first detection light.

The second detection section 42 detects the second polarization plane affected by the weak magnetism M2 produced by the object under measurement 3, the magnetic noise Nm, and the optical noise N2 contained in the second detection light.

The third detection section 43 detects the third polarization plane affected by the optical noise N1 contained in the first detection light.

The fourth detection section 44 detects the fourth polarization plane affected by the optical noise N2 contained in the second detection light.

The measurement section 6 uses a detection result from the third detection section 43 to remove influence of the optical noise N1 contained in the first detection light from a detection result from the first detection section 41. The measurement section 6 further uses a detection result from the fourth detection section 44 to remove influence of the optical noise N2 contained in the second detection light from a detection result from the second detection section 42. The measurement section 6 then uses the detection results from the first detection section 41 and the second detection section 42 from which the influence of the optical noise N1 and the optical noise N2 has been removed to remove influence of the magnetic noise Nm by which the gas cells 1 and 2 are affected. That is, the measurement section 6 measures the magnetic field produced by the object under measurement 3 in the form of the difference between the magnetic field in the gas cell 1 from which the influence of the optical noise N1 has been removed and the magnetic field in the gas cell 2 from which the influence of the optical noise N2 has been removed.

The thus configured magnetic field measurement apparatus 9 according to the embodiment of the invention measures the magnetic field produced by the object under measurement 3 with the influence of not only the magnetic noise Nm but also the optical noise N1 and N2 removed. As a result, the magnetic field produced by the object under measurement 3 is measured with improved accuracy as compared with that in related art.

2. Variations

An embodiment has been described above, and the embodiment can be changed as follows. Further, the following variations may be combined with each other.

2-1. Variation 1

In the embodiment described above, the magnetic field measurement apparatus 9 includes gas cells each of which is a cell (element) that is made of glass and seals gas atoms, but the medium that rotates the polarization plane of light that passes therethrough in accordance with the intensity of a magnetic field may be replaced with a medium other than gas atoms. For example, in the magnetic field measurement apparatus 9, the medium described above may be replaced with a solid element made, for example, of diamond with nitrogen-induced lattice defects.

2-2. Variation 2

Figure 2:
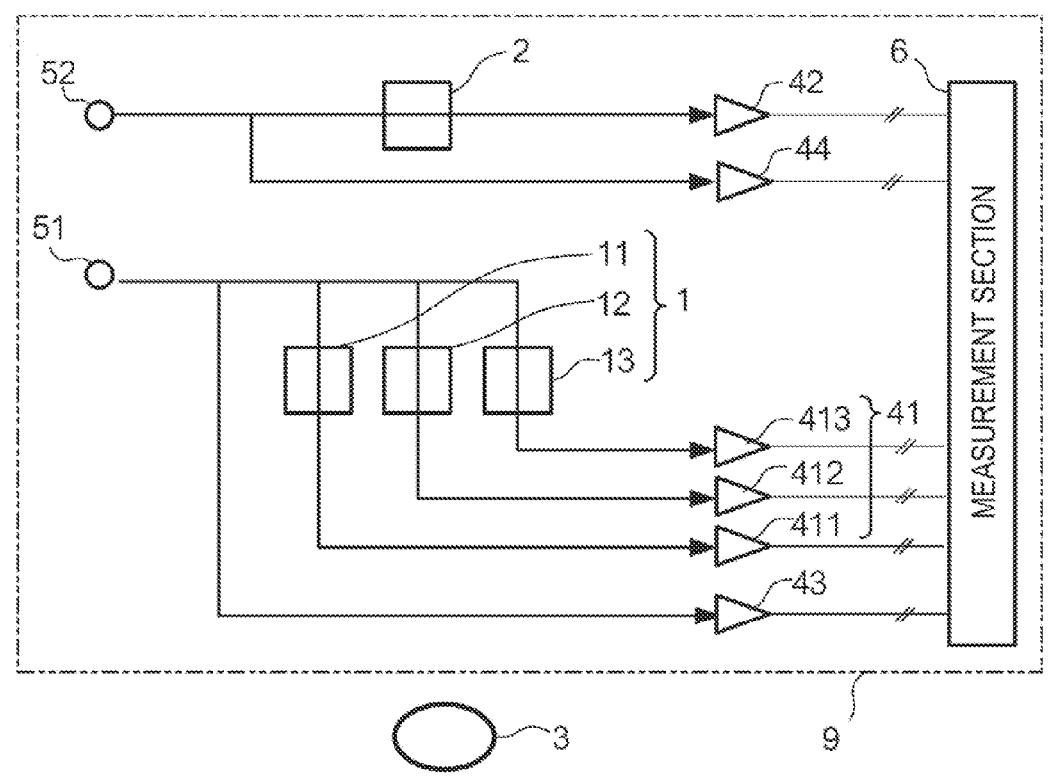
FIG. 2 shows an overall configuration of a magnetic field measurement apparatus according to a variation.

In the embodiment described above, one gas cell 1 is provided, but a plurality of gas cells 1 may be provided. FIG. 2 shows an overall configuration of the magnetic field measurement apparatus 9 according to Variation 2. Each of a gas cell 11, a gas cell 12, and a gas cell 13 shown in FIG. 2 is the gas cell 1, which is separate from the object under measurement 3 by a distance shorter than the distance therefrom to the gas cell 2. The first detection light having passed through each of the gas cell 11, the gas cell 12, and the gas cell 13 (collectively referred to as "gas cells 1" when it is not particularly necessary to distinguish them from each other) is applied to three first detection sections 411, 412, and 413 (collectively referred to as "first detection sections 41" when it not particularly necessary to distinguish them from each other). The measurement section 6 subtracts the angle of the polarization plane detected with the third detection section 43 from the angle of polarization plane detected with each of the three first detection sections 41 to remove the influence of the optical noise N1 in the corresponding one of the three gas cells 1. The measurement section 6 then measures the magnetic field produced by the object under measurement 3 in the form of the difference between the magnetic field in each of the three gas cells 1 from which the influence of the optical noise N1 has been removed and the magnetic field in the gas cell 2 from which the influence of the optical noise N2 has been removed.

Using a plurality of gas cells 1 as described above allows a greater amount of information on the magnetic field produced by the object under measurement 3 than the amount of information provided in the case where one gas cell 1 is used, whereby the measurement accuracy is improved. Further, for example, the gas cells 1 can be arranged in a plane perpendicular to the direction from the object under measurement 3 toward the gas cell 2 to detect a two-dimensional state of the magnetic field produced by the object under measurement 3.

In Variation 2, the number of third detection sections 43 may be smaller than the number of gas cells 1. For example, the number of third detection sections 43 may be determined in correspondence with the optical path of the first detection light before it is so divided that the divided light beams pass through the plurality of gas cells 1, as shown in FIG. 2. The thus configured magnetic field measurement apparatus 9 can remove at least the influence of the optical noise N1 caused to be contained in the first detection light before it is divided. Further, in the magnetic field measurement apparatus 9, to remove the influence of the optical noise N1 from the plurality of gas cells 1, it is not necessary to provide each of the plurality of gas cells 1 with the third detection section 43. That is, the number of third detections 43 can be reduced.

Further, in this case, the number of gas cells 2 may be smaller than the number of gas cells 1 and may, for example, be one. The reason for this is that the sensitivity of the gas cell 2 to the magnetism produced by the object under measurement 3 is lower than the sensitivity of the gas cell 1 to the magnetism.

2-3. Variation 3

In the embodiment described above, one gas cell 2 is provided, but a plurality of gas cells 2 may be provided. In this case, the number of fourth detection sections 44 may be smaller than the number of gas cells 2. In essence, the number of fourth detection sections 44 may be determined in correspondence with the optical path of the second detection light before it is so divided that the divided light beams pass through the plurality of gas cells 2. The thus configured magnetic field measurement apparatus 9 can remove at least the influence of the optical noise N2 caused to be contained in the second detection light before it is divided. Further, in the magnetic field measurement apparatus 9, to remove the influence of the optical noise N2 from the plurality of gas cells 2, it is not necessary to provide each of the plurality of gas cells 2 with the fourth detection section 44. That is, the number of fourth detection sections 44 can be reduced.

2-4. Variation 4

In the embodiment described above, the magnetic field measurement apparatus 9 uses pumping light and detection light to measure a magnetic field but may instead use only detection light that can be optically pumped.

What is claimed is:

1. A magnetic field measurement apparatus comprising:
  a first medium formed of a plurality of first media, the first medium allowing light from a first light source to pass therethrough and rotates a first polarization plane of linearly polarized light in accordance with an intensity of a magnetic field;
  a second medium that allows light from a second light source to pass therethrough and rotates a second polarization plane of linearly polarized light in accordance with the intensity of the magnetic field;
  a first detection section that detects the first polarization plane of linearly polarized light that has passed through the first medium;
  a second detection section that detects the second polarization plane of linearly polarized light that has passed through the second medium;
  a third detection section that detects a third polarization plane of linearly polarized light that has originated from the first light source but has not passed through the first medium;
  a fourth detection section that detects a fourth polarization plane of linearly polarized light that has originated from the second light source but has not passed through the second medium; and
  a measurement section that
    uses a detection result from the third detection section to remove optical noise from a detection result from the first detection section,
    uses a detection result from the fourth detection section to remove optical noise from a detection result from the second detection section, and
    uses the detection results from the first detection section and the second detection section from each of which the optical noise has been removed to measure a difference between the magnetic field in the first medium and the magnetic field in the second medium,
  wherein a number of third detection sections is smaller than a number of first media.

2. The magnetic field measurement apparatus according to claim 1,
  wherein the light from the first light source is divided into a plurality of light beams that respectively pass through the plurality of first media, and
  the third detection section is provided in correspondence with an optical path of the light from the first light source before divided.

3. The magnetic field measurement apparatus according to claim 1,
  wherein the magnetic field is produced by an object under measurement,
  the measurement section measures the magnetic field by measuring the difference,
  the first medium is disposed in a position closer to the object under measurement than the second medium, and
  a number of second media is smaller than the number of first media.

4. The magnetic field measurement apparatus according to claim 1,
  wherein the second medium is formed of a plurality of second media, and
  a number of fourth detection sections is smaller than a number of second media.

5. The magnetic field measurement apparatus according to claim 4,
  wherein the light from the second light source is divided into a plurality of light beams that respectively pass through the plurality of second media, and
  the fourth detection section is provided in correspondence with an optical path of the light from the second light source before divided.

* * * * *